United States Patent
Kaga et al.

(10) Patent No.: US 8,581,484 B2
(45) Date of Patent: Nov. 12, 2013

(54) LIQUID METAL ION GUN

(75) Inventors: Hiroyasu Kaga, Mito (JP); Kanehiro Nagao, Hitachinaka (JP); Motohide Ukiana, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 88 days.

(21) Appl. No.: 13/375,147

(22) PCT Filed: May 14, 2010

(86) PCT No.: PCT/JP2010/058229
§ 371 (c)(1),
(2), (4) Date: Feb. 13, 2012

(87) PCT Pub. No.: WO2010/137476
PCT Pub. Date: Dec. 2, 2010

(65) Prior Publication Data
US 2012/0126684 A1    May 24, 2012

(30) Foreign Application Priority Data
May 29, 2009  (JP) .................................. 2009-131218

(51) Int. Cl.
*H01J 27/02*  (2006.01)
*G01N 23/00*  (2006.01)
*G21G 5/00*  (2006.01)

(52) U.S. Cl.
USPC ................... 313/361.1; 313/231.01; 250/309; 250/396 R; 250/492.3; 250/493.1

(58) Field of Classification Search
None
See application file for complete search history.

(56) References Cited

U.S. PATENT DOCUMENTS

| 2005/0127304 A1 | 6/2005 | Kaga et al. |
| 2006/0054840 A1 | 3/2006 | Madokoro et al. |

(Continued)

FOREIGN PATENT DOCUMENTS

| JP | 4-14455 B2 | 3/1992 |
| JP | 05-159730 A | 6/1993 |

(Continued)

OTHER PUBLICATIONS

English translation of International Preliminary Report on Patentability issued in International Patent Application No. PCT/JP2010/058229, dated Dec. 22, 2011.

(Continued)

*Primary Examiner* — Ashok Patel
(74) *Attorney, Agent, or Firm* — McDermott Will & Emery LLP

(57) ABSTRACT

A liquid metal ion gun 3 includes a liquid metal ion source 31 and a beam limiting aperture 33. The liquid metal ion source 31 includes a reservoir 36 and an emitter 35. The reservoir 36 is made of tungsten (W) and holds liquid metal gallium (Ga). The emitter 35 is made of W. The beam limiting aperture 33 is formed with a liquid metal member 44 made of Ga placed on a base 46 made of W, has an opening 41 that enables an ion beam 2 extracted from the liquid metal ion source 31 to pass therethrough, and limits the diameter of the ion beam 2. The beam limiting aperture 33 has a groove structure 45 that causes the liquid metal 44 to gather into a region located around the opening 41. The lifetime of the beam limiting aperture can be increased, and an emission can be maintained stable for a long time period and reproducibly restored to a stable state.

9 Claims, 6 Drawing Sheets

(56) References Cited

U.S. PATENT DOCUMENTS

2007/0262263 A1* 11/2007 Kruit et al. .................... 250/424
2009/0095923 A1* 4/2009 Gierak ..................... 250/492.21

FOREIGN PATENT DOCUMENTS

| | | | |
|---|---|---|---|
| JP | 05-159730 | A | 6/1993 |
| JP | 3190395 | B2 | 5/2001 |
| JP | 2001-160369 | A | 6/2001 |
| JP | 2005-174604 | A | 6/2005 |
| JP | 2005-174604 | A | 6/2005 |
| JP | 2006-079952 | A | 3/2006 |
| JP | 2006-079952 | A | 3/2006 |

OTHER PUBLICATIONS

Office Action issued Dec. 18, 2012 in Japanese patent application No. 2009-131218.

* cited by examiner

US 8,581,484 B2

LIQUID METAL ION GUN

RELATED APPLICATIONS

This application is the U.S. National Phase under 35 U.S.C. §371 of International Application No. PCT/JP2010/058229, filed on May 14, 2010, which in turn claims the benefit of Japanese Application No. 2009-131218, filed on May 29, 2009, the disclosures of which Applications are incorporated by reference herein.

TECHNICAL FIELD

The present invention relates to a liquid metal ion source. The invention relates, for example, to a technique for ion emission from a Ga liquid metal ion source.

BACKGROUND ART

A liquid metal ion gun includes a liquid metal ion source (hereinafter referred to as LMIS) arranged in a vacuum container. The liquid metal ion gun emits an ion beam corresponding to an amount of ion emission (emission current) responsive to voltages by thermally energizing the emitter (electrode) of the LMIS through a high-voltage cable or applying a high voltage (extraction voltage) across parts of an extracting electrode. The ion beam that is emitted from the LMIS is received by a beam limiting aperture, which limits the emission current and spreading of the ion beam that will propagate toward the downstream side of the beam limiting aperture.

For the aforementioned liquid metal ion gun, for example, a gallium liquid metal ion gun, emission stability is maintained when the balance between the amount of gallium consumed by an emitter for ion irradiation purpose and the amount of gallium supplied to the emitter from a reservoir is kept, i.e., when the amount of consumed gallium is in equilibrium with the amount of supplied gallium.

However, if a foreign material mixes with gallium, then such a foreign material functions to inhibit gallium from being supplied, or the purity of the gallium is changed and the liquid metal suffers from changes in physical properties. As a result, the amount of consumed gallium is not in equilibrium with the amount of supplied gallium, which will lead to reduction in emission stability.

One example of the foreign material that will be mixed in the liquid metal of the LMIS is particles (sputtered particles) generated while the beam limiting aperture is irradiated and sputtered with the ion beam.

A conventional technique for suppressing the mixing of the sputtered particles in the liquid metal of the LMIS is described in Patent Document 1. The technique described in Patent Document 1 is as follows. A degradation in stability of an ion current is suppressed in such a manner that a part that is included in the beam limiting aperture and irradiated with the ion beam is constituted by a sintered body having low-melting-point metal mixed therein and the sputtered particles are melted in the liquid metal so as not to form a slag.

In addition, the following technique is also known. In the technique, metal that is the same type as the liquid metal of the LMIS is used for a protective diaphragm (refer to Patent Document 2 and the like). Furthermore, the following technique is also known. In the technique, the surface or all parts of an emitter electrode are made of molten metal used for the tip of the emitter electrode or made of one or more types of metal constituting an alloy used for the tip of the emitter electrode (refer to Patent Document 3 and the like).

In addition, the following technique is also known. In the technique, a beam limiting aperture that includes, as a base material, the same metal as the emitter (electrode) of the LMIS is formed, and accumulated liquid metal that is the same as the LMIS is provided in a region that is irradiated with the ion beam (refer to Patent Document 4 and the like). Furthermore, the following technique is also known. In the technique, the liquid metal of the LMIS is placed in a container having a recessed portion that includes an aperture hole in the lowest surface, while the ion beam passes through the aperture hole (refer to Patent Document 5 and the like).

PRIOR ART REFERENCES

Patent Documents

Patent Document 1: Japanese Patent No. 3190395
Patent Document 2: JP-2001-160369-A
Patent Document 3: JP-4-14455-B
Patent Document 4: JP-2005-174604-A
Patent Document 5: JP-2006-79952-A

SUMMARY OF THE INVENTION

Problems to be Solved by the Invention

In the conventional techniques described in Patent Documents 1 to 3, however, a constituent material (base material) of the beam limiting aperture is not described. Thus, it is considered that the beam limiting aperture is irradiated with the ion beam so that the constituent material (base material) of the beam limiting aperture is exposed, sputtered particles that are generated from the base material are mixed in the liquid metal of the LMIS, and the emission stability is thereby degraded. In addition, it is preferable that the LMIS be used for 1000 hours or more. As a cumulative time period for use is increased, the emission stability is gradually degraded. It is necessary to restore the state of the emission to a stable state. In the conventional techniques described in Patent Documents 1 to 3, however, the difficulty level of the restoration is not described.

Meanwhile, in the conventional techniques described in Patent Documents 4 and 5, a constituent material that is the same as that of the LMIS is used as the base material of the beam limiting aperture, and liquid metal that is the same as the LMIS is used for a part that is irradiated with the ion beam so that an effect of sputtered particles on the emission is suppressed and the emission stability can be easily restored.

The lifetime of the liquid metal ion source is increased. However, with the increase in the lifetime of the liquid metal ion source, an increase in the lifetime of the beam limiting aperture has room for improvement.

In order to achieve an increase in the lifetime of the beam limiting aperture, it is considered that the amount of the liquid metal (Ga) that is used for the beam limiting aperture is increased, for example. However, when the amount of the liquid metal is simply increased, an opening through which the ion beam passes may be clogged with the liquid metal. In addition, it is considered that the opening has a larger (wider) size in order to prevent the opening from being clogged with the liquid metal (Ga). In this case, an effect of the aperture is reduced, and the increase in the size of the opening runs counter to the purpose of the beam limiting aperture.

The present invention has been made in view of the above problems. An object of the present invention is to provide a liquid metal ion gun that is capable of increasing the lifetime of a beam limiting aperture, maintaining a stable emission for a long time period and restoring the state of the emission to a stable state while reproducibility is excellent.

Means for Solving the Problems

In order to accomplish the aforementioned object, according to the present invention, a liquid metal ion gun includes: a liquid metal ion member that is made of a first metal material; a liquid metal ion source that includes a reservoir and a emitter, the reservoir being made of a second metal material and holding the liquid metal ion member, the emitter being made of the second metal material; and a beam limiting aperture that is formed with a liquid metal member made of the first metal material placed on a base made of the second metal material, has an opening enabling an ion beam extracted from the liquid metal ion source to pass therethrough, and limits the diameter of the ion beam, wherein the beam limiting aperture has a structure that causes the liquid metal member to gather into a region located around the opening.

Effect of the Invention

According to the present invention, it is possible to increase the lifetime of the beam limiting aperture, keep stable an emission performed by the liquid metal ion gun for a long time period, and easily restore the emission stability.

MODE FOR CARRYING OUT THE INVENTION

Embodiments of the present invention are described below with reference to the accompanying drawings.

First Embodiment

Figure 1:
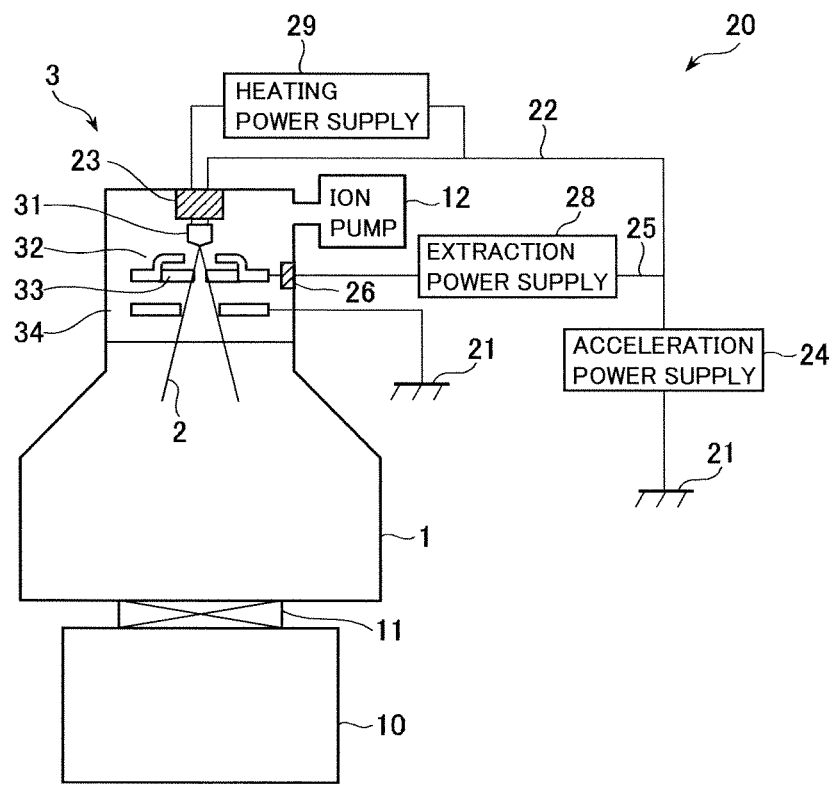
FIG. 1 is an outline diagram illustrating the entire configuration of an ion beam device according to a first embodiment of the present invention.

FIG. 1 is an outline diagram illustrating the entire configuration of an ion beam device according to a first embodiment of the present invention.

Referring to FIG. 1, the ion beam device according to the present embodiment includes a vacuum container 1; a liquid metal ion gun 3 that is arranged in the vacuum container 1 and emits an ion beam 2 to a sample (not illustrated) arranged in the vacuum container 1; a vacuum discharge device 10 that is connected to the vacuum container 1 through a gate valve 11 and evacuates the vacuum container 1; an ion pump 12 that is connected to the vacuum container 1 and evacuates the vacuum container 1; and a high-voltage power supply unit 20 that supplies power to the liquid metal ion gun 3.

The liquid metal ion gun 3 includes a liquid metal ion source (hereinafter referred to as LMIS) 31; an extracting electrode 32 that extracts the ion beam (ions) 2 from the liquid metal ion source 31; a beam limiting aperture 33 that is attached to the extracting electrode 32 and limits spreading of the ion beam 2; and an earth electrode 34 that accelerates the ion beam 2 that has passed through the beam limiting aperture 33.

The high-voltage power supply unit 20 includes a grounded earth 21; an extraction power supply 28 that applies an extraction voltage between the LMIS 31 and the extracting electrode 32 to extract the ion beam 2 from the LMIS 31; an acceleration power supply 24 that applies an acceleration voltage between the earth 21 and the LMIS 31 to accelerate the ion beam 2; a heating power supply 29 that performs electric heating on the LMIS 31; high-voltage cables 22, 25 that connect the constituent elements of the high-voltage power supply unit 20 to each other; a high-voltage connecting unit 23 that connects the high-voltage cable 22 to the LMIS 31; and a high-voltage connecting unit 26 that connects the high-voltage cable 25 to the extracting electrode 32.

The ion beam 2 that is generated by the liquid metal ion source 31 and extracted by the extracting electrode 32 passes through the beam limiting aperture 33 while the spreading of the ion beam 2 is limited by the beam limiting aperture 33. The ion beam 2 that has passed through the beam limiting aperture 33 is accelerated by the earth electrode 34 and propagates toward a downstream side. The ion beam device has the aforementioned configuration and may have a function (not illustrated) of narrowing the ion beam 2 with a lens, controlling a deflection of the ion beam 2 and irradiating the sample with the ion beam 2, and a signal detection system for detecting a signal from the sample irradiated with the ion beam 2, thereby forming a processing observation device.

Figure 2:
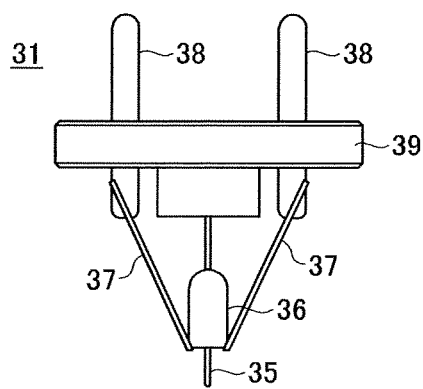
FIG. 2 is a diagram illustrating in detail the configuration of an LMIS included in a liquid metal ion gun according to the first embodiment of the present invention.

FIG. 2 is a diagram illustrating in detail the configuration of the LMIS 31 included in the liquid metal ion gun 3.

Referring to FIG. 2, the LMIS 31 is a gallium liquid metal ion source (hereinafter referred to as Ga LMIS) that includes gallium (hereinafter referred to as Ga). The Ga LMIS 31 includes an emitter 35 that has a conical tip portion (in other words, a needle-shaped tip portion); a reservoir 36 that stores Ga; a filament 37 that performs electric heating (flashing) on the emitter 35 and the Ga of the reservoir 36; a conductive terminal 38 that is connected to the filament 37; and an insulator base 39 that fixes the conductive terminal 38. The emitter 35, the reservoir 36 and the filament 37 are made of tungsten (hereinafter referred to as W), for example. In addition, the reservoir 36 is filled with Ga.

The principle of emission operation of the thus-configured LMIS 31 is outlined below. The gradient of an electric field that is inclined in an axial direction is stronger as the electric field is closer to the tip portion of the emitter 35 under the condition that the extraction voltage is applied to the LMIS 31. This is due to the fact that the tip portion of the emitter 35 is conical. Thus, Ga is supplied to the tip portion of the emitter 35 around which a strong electric field is generated due to electric field stress, and the liquid metal that is located in the vicinity of the tip portion of the emitter 35 has a pointed corner and a conical shape. A strong electric field of approximately several volts/Å exists around the corner of the liquid metal that has the conical shape due to the electric field stress. Thus, an ionization potential is reduced and electrons are lost. Therefore, ionization is easily performed. Specifically, when the strong electric field of approximately several volts/Å exists, ions fly in a vacuum and an ion current is generated.

For example, when the Ga LMIS 31 is used, it is necessary to supply the liquid metal Ga with an amount corresponding to the amount of Ga ions to be emitted during the aforementioned ion emission. However, since the Ga acts as a fluid, a pressure gradient occurs. Thus, the surface current flow of a continuous fluid occurs. Since the surface current flow is a Poiseuille flow that is caused by surface tension, the amount of the surface current flow is changed due to a change in the surface tension. In addition, pure Ga has an excellent wettability with clean W. When the W has a thin groove, the Ga diffuses through the groove due to a capillary action caused by the surface tension. Thus, as the configuration of the emitter 35, the emitter 35 that is made of W and has a thin groove extending in the axial direction is known. Similarly, the Ga that is stored in the reservoir 36 made of W is diffused through the aforementioned groove due to the capillary action caused by the surface tension and is supplied to a region located near the tip portion of the emitter. When a balance between the amount of Ga consumed by the emitter 35 for the Ga ion emission and the amount of Ga to be supplied to the emitter 35 from the reservoir 36 is maintained, or when an equilibrium between the amount of the consumed Ga and the amount of the supplied Ga is maintained, the emission stability is maintained. However, when the surface tension of the Ga is changed, the amount of the Ga to be supplied is changed and whereby the state of the emission is changed.

A basic configuration of the liquid metal ion gun 3 is described below. In the basic configuration of the liquid metal ion gun 3, a general beam limiting aperture 133 is used in the liquid metal ion gun 3 as an example.

Figure 3:
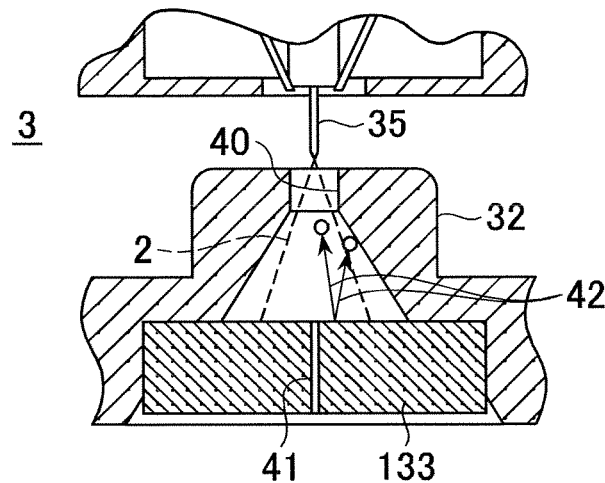
FIG. 3 is a diagram illustrating an example of the configuration of the liquid metal ion gun that uses a general beam limiting aperture.

FIG. 3 is a diagram illustrating the case in which the general beam limiting aperture 133 is used in the extracting electrode 32 of the liquid metal ion gun 3.

Referring to FIG. 3, the liquid metal ion gun 3 that has the exemplary basic configuration includes the Ga LMIS 31; the extracting electrode 32 that extracts the ion beam (ions) 2 from the Ga LMIS 31; and the beam limiting aperture 133 that is arranged on the downstream side (side toward which the ion beam 2 propagates) of the extracting electrode 32 and limits spreading of the ion beam 2.

The extracting electrode 32 is made of stainless steel and has an opening 40 which faces the emitter 35 of the Ga LMIS 31 and through which the ion beam 2 passes, for example. For example, the opening 40 has a diameter φ of 3 mm and an opening-side wall having a thickness of 1 mm. In addition, the extracting electrode 32 is arranged so that a distance between a tip of the emitter 35 and an upper surface of the extracting electrode 32 is 0.8 mm and the extracting electrode 32 is not directly irradiated with the ion beam 2. The extracting electrode 32 is configured so that parts of the extracting electrode 32 other than the opening 40 of the extracting electrode 32 are not directly irradiated with the ion beam 2 emitted from the Ga LMIS 31.

The beam limiting aperture 133 is made of tin (Sn) and has an opening 41 that is located at a location to be irradiated with the ion beam 2 extracted from the Ga LMIS 31, for example. The ion beam 2 passes through the opening 41. For example, the opening 41 has a diameter φ of 0.3 mm and an opening-side wall having a thickness of 3 mm. In addition, the beam limiting aperture 133 is arranged so that a distance between the upper surface of the extracting electrode 32 and an upper surface of the beam limiting aperture 133 is 5 mm.

The beam limiting aperture 133 is included in the extracting electrode 32, and a potential of the beam limiting aperture 133 is equal to a potential of the extracting electrode 32. The beam limiting aperture 133 has a function that is different from a function of the extracting electrode 32. The beam limiting aperture 133 has, as a diaphragm, a function of limiting the ion beam 2 that will propagate toward the downstream side thereof. The extracting electrode 32 has a function of causing ions (ion beam) 2 to be emitted by applying the voltage between the emitter 35 of the Ga LMIS 31 and the upper surface of the extracting electrode 32.

In the thus-configured liquid metal ion gun 3, the beam limiting aperture 133 is sputtered by the ion beam 2 emitted from the Ga LMIS 31 so that sputtered particles 42 are generated. A speed (processing speed) at which the beam limiting aperture 133 is sputtered depends on an incident angle. The dependence on the incident angle is described below with reference to FIG. 4.

Figure 4:
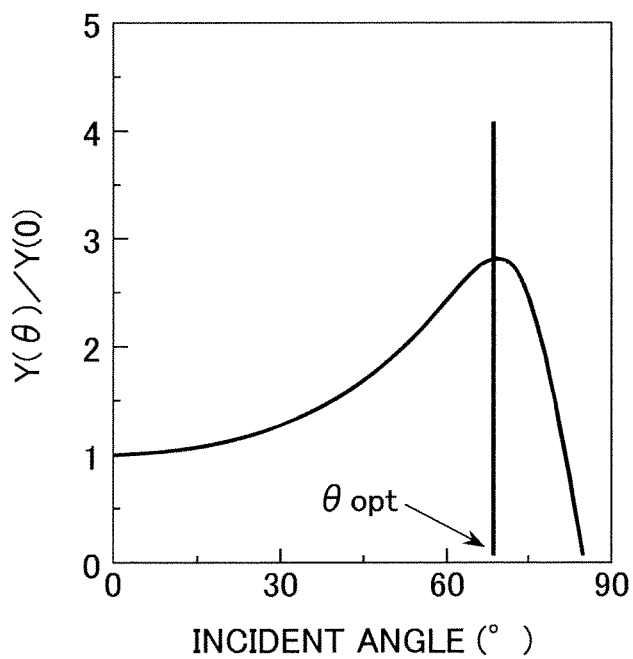
FIG. 4 is a diagram illustrating an example of dependence of a sputtering yield of a monoatomic solid imaging device on an incident angle.

FIG. 4 is a diagram illustrating an example of the dependence of a sputtering yield of a monoatomic solid imaging device on the incident angle. The abscissa indicates the incident angle (°), while the ordinate indicates a sputtering yield for each of incident angles, using, as a reference, a sputtering yield that is obtained when the incident angle is 0 degrees. In other words, FIG. 4 is a diagram illustrating the dependence of the sputtering speed at which the beam limiting aperture 133 is sputtered on the incident angle.

As illustrated in FIG. 4, regarding the sputtering yield of the monoatomic solid, as the incident angle θ (°) of the ion beam is larger, a collision cascade occurs closer to a surface. As indicated by the Zygmund's theory, for $\cos^{-f}\theta$ (f=1 to 2), the incident angle θ is increased until the incident angle θ reaches an angle θopt. For an incident angle θ that is larger than θopt, as the incident angle θ is larger, it is more difficult for the ion beam to pass through the surface due to the fact that a collision coefficient is limited by a shielding effect of adjacent atoms present on the surface. When the incident angle θ is further increased, the ion beam to be incident is reflected without providing energy to the solid, and the sputtering yield is rapidly reduced.

In addition, when the monoatomic solid is irradiated with the ion beam, the sputtering speed varies due to a variation in a crystal orientation of a crystal grain. Thus, an irregularity is formed on the surface of the monoatomic solid, while the crystal grain is used as an original point. The irregularity is further promoted due to the dependence of the sputtering speed on the incident angle. Thus, the processing speed of the surface of the monoatomic solid is increased. Therefore, the lifetime of the beam limiting aperture is reduced.

The beam limiting aperture 33 according to the present embodiment is replaced with the beam limiting aperture 133 of the liquid metal ion gun 3 having the aforementioned exemplary basic configuration. The details are described below with reference to FIGS. 5(a) to 5(c).

Figure 5:
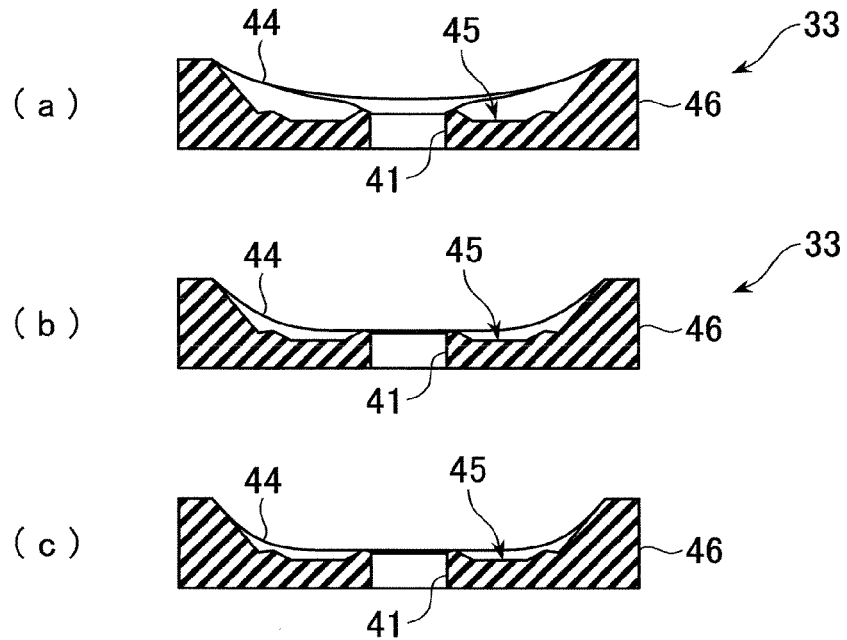
FIGS. 5(a) to 5(c) are cross-sectional views of the beam limiting aperture according to the first embodiment of the present invention.

FIGS. 5(a) to 5(c) are diagrams illustrating the beam limiting aperture 33 according to the present embodiment and are cross-sectional views taken along a plane including an optical axis of the ion beam 2. FIGS. 5(a) to 5(c) illustrate a change in the amount of the liquid metal on the beam limiting aperture 33.

Referring to FIGS. 5(a) to 5(c), the beam limiting aperture 33 includes a base 46 having a recessed portion that faces the ion beam 2 extracted from the Ga LMIS 31, and liquid metal 44 arranged on the recessed portion of the base 46. An opening 41, through which the ion beam 2 passes, is provided at the lowest point located on a surface of the recessed portion of the base 46. In other words, the opening 41 is the farthest from the Ga LMIS 31. The base 46 is made of the same material (i.e., W) as the emitter 35 of the Ga LMIS 31. The liquid metal 44 is the liquid metal (i.e., Ga) that is used for the Ga LMIS 31. A groove portion 45 is provided on the recessed portion of the beam limiting aperture 33 so that the groove portion 45 surrounds the opening 41. In addition, a tapered structure is provided between an outer circumferential part of the recessed portion of the beam limiting aperture 33 and the groove portion 45. The position of the tapered structure is higher toward the outer circumferential part from the side of the groove portion 45. Thus, a change in the shape of the surface of the liquid metal Ga 44 due to a change in the amount of the liquid metal Ga 44 is suppressed.

The radius (distance between the opening and the outer circumference of the recessed portion) of the recessed portion of the beam limiting aperture 33 is smaller than the length ($k^{-1}$) of a capillary of the liquid metal Ga 44. The length ($k^{-1}$) of the capillary is expressed by the following equation, where the surface tension of the liquid metal 44 is $\gamma$, the concentration of the liquid metal 44 is $\rho$, and a gravity acceleration is g.

[Equation 1]

$$k^{-1} = \sqrt{\frac{\gamma}{\rho \cdot g}} \quad \text{(Equation 1)}$$

In a region that is separated from the opening by a distance range that is larger than the length ($k^{-1}$) (expressed by the aforementioned Equation 1) of the capillary, the gravity is dominant for the shape of the surface (interface) of the liquid metal Ga 44. In a region that is not separated from the opening by the distance range that is larger than the length ($k^{-1}$) of the capillary, the surface tension is dominant for the shape of the surface (interface) of the liquid metal Ga 44. The length ($k^{-1}$) of the capillary of the liquid metal Ga is approximately 3.5 mm.

When Ga is placed as the liquid metal 44 on the thus-configured beam limiting aperture 33 and the surface of the W is clean, the recessed portion of the beam limiting aperture 33 completely becomes wet with the Ga. This is due to the fact that Ga has excellent wettability with clean W. The liquid metal Ga 44 is accumulated and the surface of the liquid metal Ga 44 is spherical so that a side wall of a head portion of the liquid metal Ga 44 is an outer circumference. Thus, as the liquid metal Ga 44 is farther from the opening 41 of the beam limiting aperture 33, the position of the surface of the liquid metal Ga is higher. This is due to the fact that in the region that is separated from the opening by the distance range larger than the length ($k^{-1}$) (the length of the capillary of the gallium is approximately 3.5 mm) of the capillary, the gravity is dominant so that the surface of the liquid metal is a flat surface, and that in the region that is not separated from the opening by the distance range larger than the length ($k^{-1}$) of the capillary, the surface tension is dominant so that the surface of the liquid metal Ga 44 is a curved surface.

In addition, the shape of the surface of the liquid metal Ga 44 is not affected by a structure that has the liquid metal 44 placed thereon and is located in the region that is separated from the opening by the distance range that is not larger than the length ($k^{-1}$) of the capillary. In other words, the shape of the surface of the liquid metal Ga 44 is not affected by an effect of the groove portion 45. Thus, the shape of the surface of the liquid metal Ga 44 does not depend on the amount of the liquid metal Ga 44. For the case in which the amount of the liquid metal Ga 44 placed on the recessed portion of the beam limiting aperture 33 is small, as the liquid metal Ga 44 is farther from the opening 41, the position of the surface of the liquid metal Ga 44 is higher, as illustrated in FIGS. 5(b) and 5(c). Thus, a part at which the groove portion 45 that is located on an outer circumferential portion of the opening 41 of the beam limiting aperture 33 is formed, is covered with the liquid metal Ga 44 having a thickness that is equal to or larger than the depth of the groove portion 45.

In addition, the beam limiting aperture 33 is configured so that a bottom surface of the recessed portion of the beam limiting aperture 33 is smaller than an upper surface of the recessed portion (or a cross-sectional shape is trapezoidal) and an outer circumference of the groove portion 45 is in a range corresponding to the length of a side part of the recessed portion. Thus, as illustrated in FIG. 5(b), even when the amount of the liquid metal Ga 44 is reduced, the shape of the surface of the liquid metal Ga 44 is not significantly changed. In addition, as illustrated in FIG. 5(c), even when the amount of the liquid metal Ga 44 is further reduced, the liquid metal Ga 44 flows from the side part of the recessed portion onto the groove portion 45 due to the surface tension of the liquid metal Ga 44 to fill in the region. Thus, the surface of the liquid metal Ga 44 is maintained flat.

Figure 6:
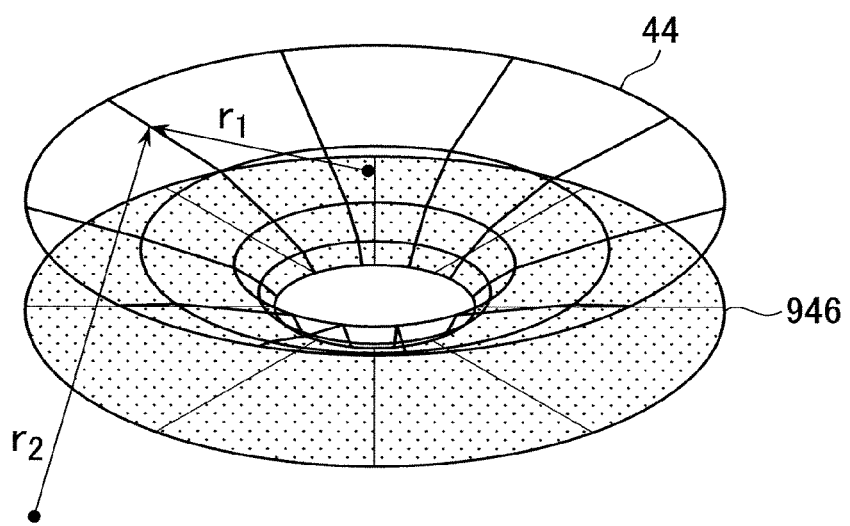
FIG. 6 is a diagram illustrating the relationship between surface tension of liquid metal in the vicinity of an opening of the beam limiting aperture and internal pressure (Laplace pressure) of the liquid metal.

Next, how easy the opening 41 becomes clogged with the liquid metal Ga 44 is considered from the perspective of internal pressure of the liquid metal Ga 44. The surface tension and internal pressure (Laplace pressure) of a liquid such as liquid metal are balanced so that surface energy that is given by surface tension (and is not given by the gravity) is minimized. FIG. 6 is a diagram illustrating the state in which the surface tension and internal pressure (Laplace pressure) of the liquid metal Ga 44 located around the opening 41 are balanced. In FIG. 6, the internal pressure $\Delta P$ is expressed by the following Equation 2, where a curvature of a curved surface relating to a surface parallel to the opening 41 and a curvature of a curved surface relating to a surface perpendicular to the opening 41 are r1 and r2, respectively.

[Equation 2]

$$\Delta P = \gamma \cdot \left(\frac{1}{r_1} + \frac{1}{r_2}\right) \quad \text{(Equation 2)}$$

In the aforementioned Equation 2, it is assumed that a direction in which the internal pressure $\Delta P$ (Laplace pressure) is applied from the side of the surface of the liquid metal 44 to the inner side of the liquid metal 44 in the opening 41 is a positive direction. In addition, it is assumed that when the original points of the curvature radii r1 and r2 exist on the side of an inner surface of the liquid metal, the curvature radii are positive, and that when the original points of the curvature radii r1 and r2 exist on the side of an outer surface of the liquid metal, the curvature radii are negative. In FIG. 6, r1<0, and 0<r2. For example, when the amount of the liquid metal Ga 44 is increased, the thickness of the opening 41 becomes nearly equal to the diameter of the opening and θE (contact angle) is large, the Laplace pressure immediately becomes negative (θP<0) and the opening 41 becomes clogged with the liquid metal Ga 44.

As described above, in the region that is separated from the opening by the distance range that is larger than the length ($k^{-1}$) of the capillary, the gravity is dominant for the shape of the surface (interface) of the liquid metal Ga 44. In the region that is separated from the opening by the distance range that is not larger than the length ($k^{-1}$) of the capillary, the surface tension is dominant for the shape of the surface of the liquid metal Ga 44. The length ($k^{-1}$) of the capillary of the liquid metal Ga is approximately 3.5 mm. For example, when an inner diameter φ of the recessed portion of the beam limiting aperture 33 is set to a value that is equal to or smaller than 7 mm (or a distance between the opening and the outer circumference is set to a value that is equal to or smaller than 3.5 mm), the liquid metal Ga 44 is placed, and a curvature of the surface of the liquid metal Ga 44 is equal to or smaller than 3.5 mm, the surface tension of the liquid metal Ga 44 is larger than the gravity and an effect of the gravity is small. However, when the liquid metal Ga 44 is placed on the beam limiting aperture 33 so that the curvature of the surface of the liquid metal Ga 44 is equal to or larger than 3.5 mm, the effect of the gravity is large. Especially, since a curvature of the liquid metal Ga 44 in the vicinity of the opening 41 is small, the liquid metal Ga 44 in the vicinity of the opening 41 has negative surface tension. Thus, the opening 41 easily becomes clogged with the liquid metal Ga 44.

A shock that is applied from the outside to the liquid metal Ga 44 in the vicinity of the opening 41 is several G. In order to prevent the opening 41 from being clogged due to a movement (caused by the shock) of the liquid metal Ga 44, it is necessary that the curvature $r_1$ (shown in the Equation 2) according to the amount of the liquid metal Ga 44 of the beam limiting aperture 33 be several times smaller than the length ($k^{-1}$) of the capillary in consideration of the fact that the length ($k^{-1}$) of the capillary is proportional to a value ($1/\sqrt{g}$) (g: impulsive force).

An effect of the thus-configured present embodiment is described below with reference to FIGS. 7(a) and 7(b).

Figure 7:
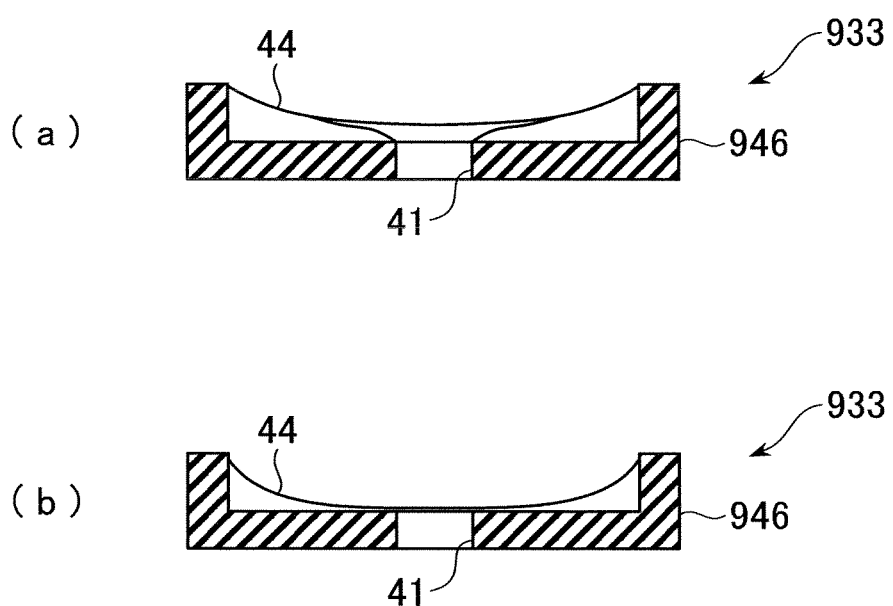
FIGS. 7(a) and 7(b) are cross-sectional views of a beam limiting aperture according to a comparative example with respect to the first embodiment of the present invention.

FIGS. 7(a) and 7(b) are diagrams illustrating a beam limiting aperture 933 according to a comparative example with respect to the first embodiment. In FIGS. 7(a) and 7(b), parts that are the same as the parts illustrated in FIGS. 5(a) to 5(c) are indicated by the same reference numerals. In the comparative example illustrated in FIGS. 7(a) and 7(b), the beam limiting aperture 933 includes a base 946 having a recessed portion that faces the ion beam 2 extracted from the Ga LMIS 31, and liquid metal 44 that is arranged on the recessed portion of the base 946. In addition, an opening 41 through which the ion beam 2 passes is provided on a bottom surface of the recessed portion of the base 946. The base 946 is made of W and the liquid metal 44 is Ga.

In the thus-configured beam limiting aperture 933 according to the comparative example, when the amount of the liquid metal Ga 44 placed on the recessed portion is sufficient, particles that are generated by sputtering by the ion beam 2 are Ga particles. Even when the sputtered particles are attached to the emitter 35 of the Ga LMIS 31, the sputtered particles do not cause a change in a property of the Ga of the emitter 35. Thus, it is possible to suppress a reduction in the stability of the emission from the Ga LMIS 31.

However, when the amount of the liquid metal Ga 44 placed on the recessed portion of the beam limiting aperture 933 is reduced due to an emission performed for a long time period, the tungsten (W) that is a base material is exposed so that sputtered tungsten particles are generated. When the W is attached to the emitter 35, the supply of the Ga from the reservoir 36 to the emitter 35 is prevented so that the emission from the Ga LMIS 31 is reduced. Especially, when the sample is to be irradiated with the ion beam 2 of a large current and a high current density, the diameter of the beam is reduced by reducing the distance between the Ga LMIS 31 and the beam limiting aperture 933. Thus, the amount of sputtered particles (W) attached to the emitter 35 increases and the reduction in the emission is more noticeable. This is due to the following fact. When the distance between the Ga LMIS 31 and the beam limiting aperture 933 is reduced, the area of a region that is included in the beam limiting aperture 933 and irradiated with the ion beam 2 is reduced and an irradiation current density is increased. Thus, the number of sputtered particles to be generated per unit area is increased. Thus, the amount of sputtered particles attached to the emitter 35 is increased, and a viewing angle (solid angle to be formed by sputtered particles capable of being attached to the Ga LMIS 31, and the angle is expressed by dividing the area by the square of the distance) of the Ga LMIS 31 is increased. Therefore, the amount of the sputtered particles attached to the emitter 35 increases. When the rate of the reduction in the emission is increased, and the emission is controlled to be constant by changing the extraction voltage on the basis of the reduction in the emission, the optical axis and a focus are changed. When the extraction voltage is not controlled and the reduction in the emission is not controlled, the beam current of the ion beam 2 is reduced and a region to be irradiated cannot be processed.

In addition, the reduction in the emission due to the attachment of the sputtered particles (W) to the emitter 35 can be eliminated by flashing when necessary so that the original emission is achieved. However, when a base material of the beam limiting aperture 933 is sputtered, sputtered W particles are generated. In this case, the opening through which the ion beam 2 passes becomes spread, and the lifetime of the beam limiting aperture 933 is reduced.

In addition, it can be considered that the exposure of the W that is the base material is suppressed by increasing the amount of the liquid metal 44 (Ga) to be placed on the recessed portion of the beam limiting aperture 933. However, when the amount of Ga is simply increased, the opening through which the ion beam passes may become clogged with the Ga. In addition, it can be considered that the size of the opening is increased to prevent the opening from becoming clogged with the Ga. In this case, an effect of reducing the diameter of the ion beam is reduced, and the increase in the size of the opening runs counter to the purpose of the beam limiting aperture.

In contrast, in the present embodiment, the beam limiting aperture has the following structure: the liquid metal gallium (Ga) is placed on the base 46 made of tungsten (W); the opening that enables the ion beam 2 extracted from the Ga LMIS 31 to pass therethrough is provided; the recessed portion is provided on the base 46 of the beam limiting aperture 33 that limits the diameter of the ion beam 2 so that the recessed portion includes the opening; the groove portion 45 is provided on the inner side of the recessed portion and surrounds the opening 41; and the liquid metal Ga is gathered into a region located around the opening 41. Thus, the liquid metal Ga gathers into the region located around the opening of the beam limiting aperture 33. The thickness of the liquid metal Ga located in the vicinity of the opening is thereby large. Thus, it is possible to increase a time period from the time when the amount of the liquid metal Ga 44 is reduced by sputtering caused by the irradiation with the ion beam 2 to the time when the tungsten W that is the base material is exposed and starts to be sputtered. Therefore, the lifetime of the beam limiting aperture 33 can be increased. Since the amount of the liquid metal Ga 44 that can be placed on the beam limiting aperture 33 is increased by provision of the groove portion 45, the lifetime of the beam limiting aperture 33 can be further increased. In addition, the distance between the opening 41 of the beam limiting aperture 33 and the outer circumference of the recessed portion is smaller than the length ($k^{-1}$) of the capillary of the liquid metal Ga 44. Thus, even when the amount of the liquid metal Ga 44 is reduced, the liquid metal Ga 44 flows and gathers into the region located around the opening 41 due to the surface tension of the liquid metal Ga located around the opening 41 and the lifetime of the beam limiting aperture 33 can be increased.

In addition, gallium (Ga) is placed as the liquid metal on the beam limiting aperture 33. When the amount of the liquid metal Ga 44 is sufficient, particles that are generated by sputtering by the ion beam are Ga particles. Even when the sputtered particles are attached to the emitter 35 of the Ga LMIS 31, the sputtered particles do not cause a change in the property of the Ga of the emitter 35. Thus, it is possible to suppress a reduction in the stability of the emission from the Ga LMIS 31. Therefore, the emission that is performed by the liquid metal ion gun can be maintained stable for a long time period. For example, when the liquid metal ion gun operates so that the ultimate degree of vacuum in the liquid metal ion gun is $10^{-7}$ Pa, the extraction voltage applied between the emitter 35 and the extracting electrode 32 is 7 kV, and an emission current is 2.4 μA, the emission can be continuously maintained stable for a time period of 120 hours without maintenance such as the flashing, emission control and an adjustment of the beam focus.

In addition, the base material of the base 64 of the beam limiting aperture 33 is tungsten (W). Thus, when the amount of the liquid metal Ga 44 is reduced, the base 46 is exposed and sputtered by the ion beam 2, and sputtered particles (W) generated by the sputtering are attached to the emitter 35 so as to reduce the emission, the emission can be restored to the original emission by the flashing of the Ga LMIS 31 when necessary. Thus, the emission stability for the liquid metal ion gun can be easily restored.

In addition, as a contamination of the Ga LMIS 31, a Ga oxide that is generated by the emission can be considered. As the amount of the Ga oxide is increased, the emission is reduced. However, the state (the emission current, a necessary extraction voltage and the stability) of the emission can be reproducibly restored by performing the flashing (heating) at a temperature of approximately 700° C. for a time period of approximately 30 seconds.

In addition, since the base material of the base 64 of the beam limiting aperture 33 is tungsten (W), the speed at which the base is sputtered by the ion beam 2 is lower compared with the case in which the base material of the base 64 is tin (Sn). The diameter of a crystal grain of Sn is in a range of approximately 6 μm to 10 μm, while the diameter of a crystal grain of W is approximately 1 μm and small. Thus, an irregularity is hardly formed on the surface of the W at the time of the irradiation with the ion beam due to a variation in a crystal orientation of the crystal grain, and the sputtering speed is low. Thus, the lifetime of the beam limiting aperture 33 can be increased.

If sputtered particles are tin (Sn) and attached to the Ga LMIS 31, a compound of the sputtered particles and liquid metal Ga is generated. When the mass percent concentration of the sputtered particles in the liquid metal Ga is equal to or lower than approximately 10 wt %, the melting point of the compound is equal to or lower than approximately 30° C. Thus, the sputtered particles are melted into the liquid metal Ga. As a result, physical characteristics such as the surface tension and melting point of the liquid metal Ga are changed, and the emission becomes unstable. In contrast, in the present embodiment, since the base material of the base 64 of the beam limiting aperture 33 is tungsten (W), the emission that is performed by the liquid metal ion gun can be maintained stable for a long time period.

Figure 8:
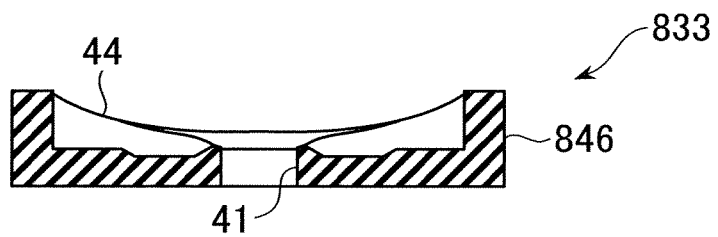
FIG. 8 is a cross-sectional view of a modified example of the beam limiting aperture according to the first embodiment of the present invention.

In the first embodiment, the tapered structure is provided between an outer circumferential portion of the beam limiting aperture 33 and the groove portion 45 so that as the tapered structure is closer to the outer circumferential portion from the groove portion 45, the position of the tapered structure is higher. As illustrated in a modified example (illustrated in FIG. 8) of the first embodiment, the outer circumferential portion and a part that corresponds to the bottom surface of the recessed portion may form a substantially right angle.

Second Embodiment

A second embodiment of the present invention is described below with reference to FIG. 9. In the present embodiment, a beam limiting aperture 233 is provided instead of the beam limiting aperture 33 of the liquid metal ion gun according to the first embodiment.

Figure 9:
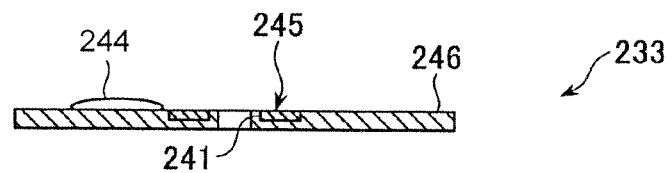
FIG. 9 is a cross-sectional view of a beam limiting aperture according to a second embodiment of the present invention.

Referring to FIG. 9, the beam limiting aperture 233 includes a plate-like base 246 made of the same material (i.e., W) as the emitter 35 of the Ga LMIS 31, and liquid metal 244 placed on the base 246. The liquid metal 246 is the liquid metal (i.e., Ga) that is used for the Ga LMIS 31. In addition, an opening 241 through which the ion beam 2 passes is provided at a location that is included in the base 246 and irradiated with the ion beam 2. The base 246 has a groove portion 245 that surrounds the opening 241. A lump of liquid metal Ga is placed on the surface of the beam limiting aperture 233 and melted. Then, the beam limiting aperture 233 is brought in a supercooled atmosphere having a temperature of −20° C. to solidify the melted liquid metal Ga placed on the beam limiting aperture 233. The liquid metal 244 can thereby move with the beam limiting aperture 233 in an integrated manner and be easily placed in the liquid metal ion gun. Other configurations are the same as those of the first embodiment.

In the thus-configured present embodiment, the liquid metal gallium (Ga) is placed on the base 246 made of tungsten (W) so that the beam limiting aperture 233 is formed. The groove portion 245 is provided and surrounds the opening 241 of the beam limiting aperture 233. The beam limiting aperture 233 has a structure that causes the liquid metal Ga 244 to gather into a region located around the opening 241. Thus, the liquid metal Ga gathers into the region located around the opening of the beam limiting aperture 233. The thickness of the liquid metal Ga in the vicinity of the opening is thereby large. Thus, it is possible to increase a time period from the time when the amount of the liquid metal Ga 244 is reduced by sputtering caused by the irradiation with the ion beam 2 to the time when the tungsten W that is the base material is exposed and starts to be sputtered. Therefore, the lifetime of the beam limiting aperture 233 can be increased.

Since the amount of the liquid metal Ga 244 that can be placed on the beam limiting aperture 233 is increased by provision of the groove portion 245, the lifetime of the beam limiting aperture 233 can be further increased.

In addition, gallium (Ga) is placed as the liquid metal on the beam limiting aperture 233. Thus, when the amount of the liquid metal 244 is sufficient, particles that are generated by sputtering by the ion beam 2 are Ga particles. Even when the sputtered particles are attached to the emitter 35 of the Ga LMIS 31, the sputtered particles do not cause a change in the property of the Ga of the emitter 35. Thus, it is possible to suppress a reduction in the stability of the emission from the Ga LMIS 31. Therefore, the emission that is performed by the liquid metal ion gun can be maintained stable for a long time period.

In addition, the base material of the base 264 of the beam limiting aperture 233 is tungsten (W). Thus, even when the amount of the liquid metal Ga 244 is reduced, the base 246 is exposed and sputtered by the ion beam 2, and sputtered particles (W) generated by the sputtering are attached to the emitter 35 so that the emission is reduced, the emission can be restored to the original emission by performing the flashing on the Ga LMIS 31 when necessary. Thus, the emission stability for the liquid metal ion gun can be easily restored.

Third Embodiment

A third embodiment of the present invention is described below with reference to FIG. 10. In the present embodiment, an annular member 347 is provided on the beam limiting aperture 233 of the liquid metal ion gun according to the second embodiment and surrounds the groove portion 245.

Figure 10:
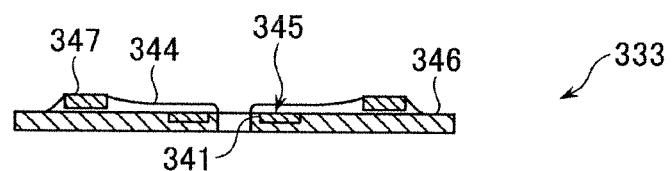
FIG. 10 is a cross-sectional view of a beam limiting aperture according to a third embodiment of the present invention.

Referring to FIG. 10, a beam limiting aperture 333 includes a plate-like base 346 made of the same material (i.e., W) as that of the emitter 35 of the Ga LMIS 31, and liquid metal 344 placed on the base 346. The liquid metal 344 is the liquid metal (i.e., Ga) that is used for the Ga LMIS 31. In addition, an opening 341 through which the ion beam 2 passes is provided at a location that is included in the base 346 and irradiated with the ion beam 2. The base 346 has a groove portion 345 that surrounds the opening 341. In addition, the annular member 347 is provided so as to surround the groove portion 345 and not to overlap a region that is irradiated with the ion beam 2. The annular member 347 forms a recessed portion that includes the opening 341. The annular member 347 is made of tungsten or a sintered tungsten body, for example.

In the thus-configured present embodiment, an effect that is the same as or similar to the second embodiment can be obtained.

Fourth Embodiment

A fourth embodiment of the present invention is descried below with reference to FIG. 11. In the present embodiment, a beam limiting aperture 433 is provided instead of the beam limiting aperture 33 of the liquid metal ion gun according to the first embodiment.

Figure 11:
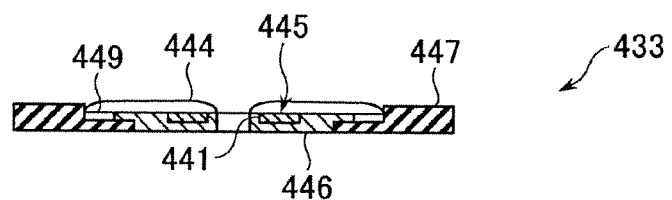
FIG. 11 is a cross-sectional view of a beam limiting aperture according to a fourth embodiment of the present invention.

Referring to FIG. 11, the beam limiting aperture 433 includes a plate-like base 446 made of the same material (i.e., W) as that of the emitter 35 of the Ga LMIS 31, and liquid metal 444 placed on the base 446. The liquid metal 444 is the liquid metal (i.e., Ga) that is used for the Ga LMIS 31. An opening 441 through which the ion beam 2 passes is provided at a location that is included in the base 446 and irradiated with the ion beam 2. The base 446 has a groove portion 445 that surrounds the opening 441. In addition, an annular member 447 surrounds the groove portion 445 and is provided in a region that is not irradiated with the ion beam 2. The annular member 447 forms a recessed portion that includes the opening 441. In addition, a groove portion 449 is formed in an outer circumferential part of the recessed portion in the base 446, or is formed at a boundary between the base 446 and the annular member 447 so as to surround the recessed portion. The annular member 447 is made of a substance (such as an aluminum oxide ($Al_2O_3$), molybdenum (Mo) or the like) that does not react with the liquid metal Ga 444 at a temperature of 100° C. or lower. Wettability of tungsten (W) and gallium (Ga) is described here. Tungsten (W) and gallium (Ga) have excellent wettability with the other substance. However, when tungsten (W) is oxidized, tungsten (W) and gallium (Ga) have poor wettability with the other substance. To obtain a clean tungsten (W) surface that is not oxidized, the base 446 made of W is dipped in a sodium hypochlorite solution for one hour. Alternately, after a contamination on the surface is removed by electric field-assisted polishing by use of an electrolyte such as NaOH, ultrasonic cleaning is performed using pure water so that the clean tungsten (W) surface that is not oxidized is obtained. Other configurations are the same as those of the first embodiment.

In the present embodiment thus configured, an effect that is the same as or similar to that of the second embodiment can be obtained.

Fifth Embodiment

A fifth embodiment of the present invention is described below with reference to FIG. 12. In the present embodiment, a beam limiting aperture 533 is provided instead of the beam limiting aperture 33 of the liquid metal ion gun according to the first embodiment.

Figure 12:
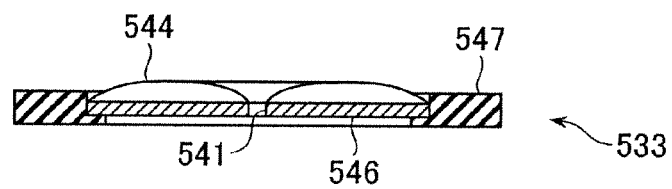
FIG. 12 is a cross-sectional view of a beam limiting aperture according to a fifth embodiment of the present invention.

Referring to FIG. 12, the beam limiting aperture 533 includes a plate-like base 546 made of the same material (i.e., W) as that of the emitter 35 of the Ga LMIS 31, and liquid metal 544 placed on the base 546. The liquid metal 544 is the liquid metal (i.e., Ga) that is used for the Ga LMIS 31. In addition, an opening 541 through which the ion beam 2 passes is provided at a location that is included in the base 546 and irradiated with the ion beam 2. Furthermore, an annular member 547 surrounds the opening 541 and is provided in a region that is not irradiated with the ion beam 2. The annular member 547 forms a recessed portion that includes the opening 541. The annular member 547 is made of a material (such as stainless steel (SUS)) that has poor wettability with the liquid metal Ga. In addition, the diameter of the recessed portion, or a distance between the opening 541 and an outer circumference of the recessed portion, is smaller than the length of the capillary of the liquid metal Ga 544. In addition, in order to make the tungsten (W) used for the base 546 and the liquid metal Ga 544 have complete wettability with the other substance, the base 546 is heated in vacuum at a temperature of 1000° C. or higher to completely remove oxygen and a contamination. After that, the gallium (Ga) is placed on the base and then melted. Other configurations are the same as those of the first embodiment.

An effect of the thus-configured present embodiment is described below with reference to FIG. 13.

Figure 13:
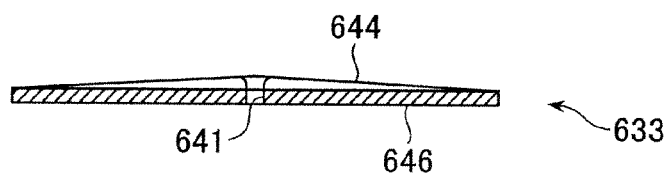
FIG. 13 is a cross-sectional view of a beam limiting aperture according to a comparative example with respect to the fifth embodiment of the present invention.

FIG. 13 is a diagram illustrating a beam limiting aperture 633 according to a comparative example with respect to the present embodiment. In the comparative example illustrated in FIG. 13, the beam limiting aperture 633 includes a base 646 made of W and liquid metal Ga 644 placed on the base 646. In addition, an opening 641 through which the ion beam 2 passes is provided on the base 646. In the thus-configured beam limiting aperture 633 according to the comparative example, the liquid metal Ga 644 placed on the base 646 spreads on the base 646. Thus, it is difficult to achieve a sufficient thickness of the liquid metal Ga 644 in a region that is irradiated with the ion beam 2.

In contrast, in the present embodiment, the beam limiting aperture 533 includes the base 546 made of tungsten (W), and the annular member 547 that is provided on the base 546 so as to surround the opening 541 and form the recessed portion including the opening 541. The annular member 541 is made of the material that has poor wettability with the liquid metal Ga 544. Thus, the annular member 541 does not become wet with the liquid metal Ga 544 placed on the recessed portion of the beam limiting aperture 533, and the liquid metal Ga 544 is repelled from the annular member 541 and gathers into a region located around the opening 541. Since the liquid metal Ga 544 gathers into the region located around the opening 541 of the beam limiting aperture 533, the thickness of the liquid metal Ga 544 in the vicinity of the opening is thereby large. Thus, it is possible to increase a time period from the time when the amount of the liquid metal Ga 544 is reduced by sputtering caused by the irradiation with the ion beam 2 to the time when the tungsten W that is the base material is exposed and starts to be sputtered. Therefore, the lifetime of the beam limiting aperture 533 can therefore be increased.

In addition, the distance between the opening 541 of the beam limiting aperture 533 and the outer circumference (i.e., annular member 541) of the recessed portion is smaller than the length ($k^{-1}$) of the capillary of the liquid metal Ga 544. Thus, even when the amount of the liquid metal Ga 544 is reduced, the liquid metal Ga 544 flows and gathers into the region located around the opening 541 due to the surface tension of the liquid metal Ga 544 located around the opening 541, and the lifetime of the beam limiting aperture 533 can be increased.

In addition, gallium (Ga) is placed as the liquid metal on the beam limiting aperture 533. Thus, when the amount of the liquid metal Ga 544 is sufficient, particles that are generated by sputtering by the ion beam 2 are Ga particles. Even when the sputtered particles are attached to the emitter 35 of the Ga LMIS 31, the sputtered particles do not cause a change in the property of the Ga of the emitter 35. Thus, it is possible to suppress a reduction in the stability of the emission from the Ga LMIS 31. Therefore, the emission that is performed by the liquid metal ion gun can be maintained stable for a long time period.

In addition, the base material of the base 546 of the beam limiting aperture 533 is tungsten (W). Thus, when the amount of the liquid metal Ga 544 is reduced, the base 546 is exposed and sputtered by the ion beam 2, and sputtered particles (W) generated by the sputtering are attached to the emitter 35 so that the emission is reduced, the emission can be restored to the original emission by performing the flashing on the Ga LMIS 31 when necessary. Thus, the emission stability for the liquid metal ion gun can be easily restored.

As a contamination of the Ga LMIS 31, a Ga oxide that is generated by the emission can be considered. As the amount of the Ga oxide is increased, the emission is reduced. However, the state (the emission current, a necessary extraction voltage and the stability) of the emission can be reproducibly restored by performing the flashing (heating) at a temperature of approximately 700° C. for a time period of approximately 30 seconds.

The embodiments of the present invention are described above. However, each of the embodiments of the present invention is susceptible to various changes and can be combined with the other embodiments within the spirit of the invention.

First Example

Figure 14:
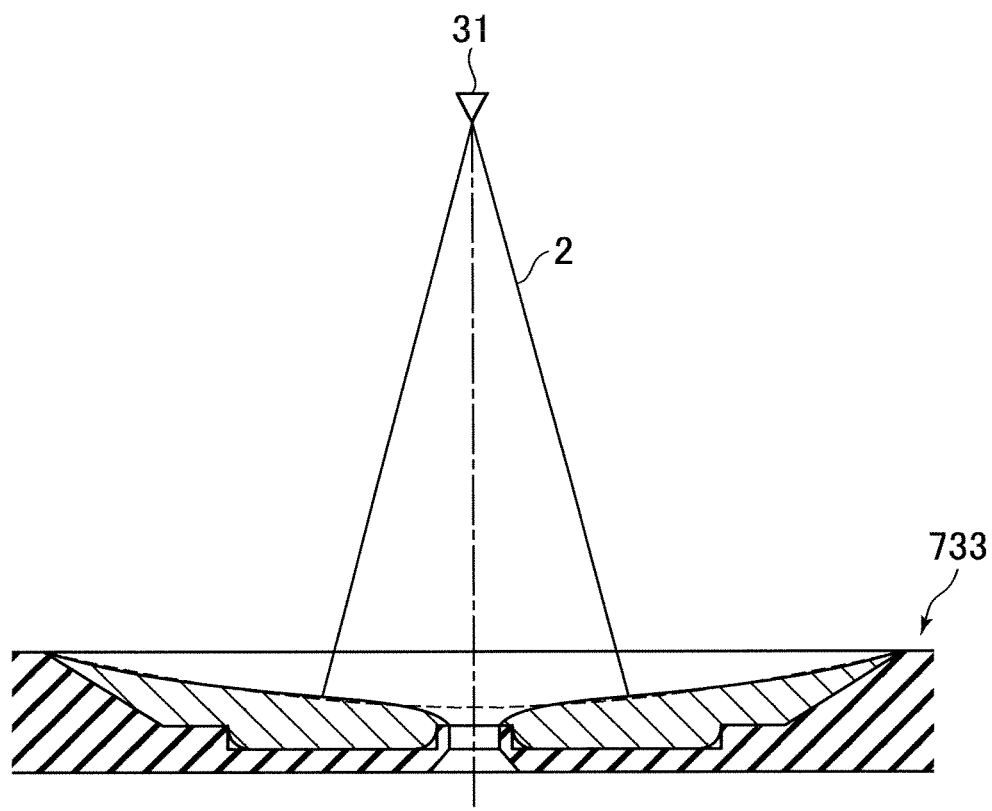
FIG. 14 is a cross-sectional view of the beam limiting aperture according to each of the embodiments of the present invention.

FIG. 14 is a cross-sectional view of a beam limiting aperture according to a first example and illustrates the example when the present invention is applied.

A beam limiting aperture illustrated in FIG. 14 has an outer diameter ϕ of 10 mm and a thickness of 1 mm. The beam limiting aperture illustrated in FIG. 14 has an upper surface having a diameter ϕ of 6.85 mm and a bottom surface having a diameter ϕ of 5 mm, and is tapered 33 degrees from the upper surface to the bottom surface. A distance between the upper surface and the bottom surface of a recessed portion is 0.6 mm. In addition, an opening that has a diameter ϕ of 0.4 mm is provided at the center of the bottom surface of the recessed portion. Furthermore, the bottom surface has a groove portion having a depth of 0.2 mm. The groove portion is located in a range from a diameter ϕ of 0.6 mm to a diameter ϕ of 4 mm from the center of the bottom surface. A back surface of the opening is chamfered by 0.2 mm in a height direction.

The amount of the liquid metal Ga that is accumulated on the groove portion of the thus-configured beam limiting aperture is approximately 15 mg, and corresponds to the amount (of the liquid metal Ga) that is reduced by sputtering caused by ion irradiation performed for approximately 1000 hours while an emission current from the Ga LMIS is set to 3.2 μA. In other words, the lifetime of the beam limiting aperture can be increased by approximately 1000 hours compared with a beam limiting aperture that does not have the groove portion.

In addition, when the liquid metal Ga with an amount of 60 mg is placed on the beam limiting aperture 733, the shape of an interface of the liquid metal Ga corresponds to the shape of an interface of the liquid metal Ga whose amount is 45 mg and that is placed in the case in which the groove portion is not provided. Thus, the amount of the liquid metal Ga can be increased without changing the state of the liquid metal Ga sputtered by the ion beam 2.

When the emission current from the Ga LMIS 31 is 2 μA, and the distance between the Ga LMIS 31 and the beam limiting aperture 733 is 5 mm, a region that is located on the beam limiting aperture 733 and irradiated with the ion beam 2 has a diameter ϕ of 2.6 mm. Thus, the region to be irradiated with the ion beam 2 is located in the range of up to the diameter ϕ of 4 mm while the groove portion having the depth of 0.2 mm is provided in the range. The base material is hardly exposed in such a range even when the amount of the liquid metal Ga is reduced. Thus, the lifetime of the beam limiting aperture can be increased compared with the case in which the groove portion is not provided.

In addition, the distance between the opening of the beam limiting aperture and the outer circumference of the recessed portion is smaller than the length ($k^{-1} \cong 3.5$ mm) of the capillary of the liquid metal Ga. Thus, even when the amount of the liquid metal Ga is reduced, the liquid metal Ga flows and gathers into the region located around the opening due to the surface tension of the liquid metal Ga located around the opening. The lifetime of the beam limiting aperture can therefore be increased.

In addition, gallium (Ga) is placed as the liquid metal on the beam limiting aperture. Thus, when the amount of the liquid metal Ga is sufficient, particles that are generated by sputtering by the ion beam are Ga particles. Even when the sputtered particles are attached to the emitter of the Ga LMIS, the sputtered particles do not cause a change in the property of the Ga of the emitter. Thus, it is possible to suppress a reduction in the stability of the emission from the Ga LMIS 31. Therefore, the emission that is performed by the liquid metal ion gun can be maintained stable for a long time period.

In addition, the base material of the base of the beam limiting aperture is tungsten (W). Even when the amount of the liquid metal Ga is reduced, the base is exposed and sputtered by the ion beam, and sputtered particles (W) generated by the sputtering are attached to the emitter so that the emission is reduced, the emission can be restored to the original emission by performing the flashing on the Ga LMIS when necessary. Thus, the emission stability for the liquid metal ion gun can be easily restored.

DESCRIPTION OF THE REFERENCE NUMERALS

1 Vacuum container
2 Ion beam
3 Liquid metal ion gun
10 Vacuum discharge device
11 Gate valve
12 Ion pump
20 High-voltage power supply unit
21 Earth electrode
22, 25 High-voltage cable
23, 26 High-voltage connecting unit
24 Acceleration power supply
27 Extraction power supply
29 Heating power supply
31 Liquid metal ion source
32 Extracting electrode
33 Beam limiting aperture
34 Earth electrode
35 Emitter
36 Reservoir
37 Filament
38 Conductive terminal
39 Insulator base
40, 41 Opening
42 Sputtered particle

The invention claimed is:

1. A liquid metal ion gun comprising:
a liquid metal member that is made of a first metal material;
a liquid metal ion source that includes a reservoir and a emitter, the reservoir being made of a second metal material and holding the liquid metal member, the emitter being made of the second metal material; and
a beam limiting aperture that is formed with a liquid metal member made of the first metal material placed on a base made of the second metal material, has an opening enabling an ion beam extracted from the liquid metal ion source to pass therethrough, and limits the diameter of the ion beam,
wherein the beam limiting aperture has a structure that causes the liquid metal member to gather into a region located around the opening,
the base has a recessed portion that is provided so as to include the opening, and
a distance between the opening and an outer circumference of the recessed portion is smaller than a capillary length of the liquid metal member made of the first metal material.

2. The liquid metal ion gun according to claim 1,
wherein the base has a groove structure that is provided on an inner side of the recessed portion and surrounds the opening.

3. The liquid metal ion gun according to claim 1,
wherein the base includes a groove structure that is provided so as to surround the opening, and
wherein an annular member is placed so as to surround the groove structure, and forms a recessed portion that includes the opening.

4. The liquid metal ion gun according to claim 1, further comprising:
an annular member that is provided so as to surround the opening, and forms a recessed portion that includes the opening,
wherein the annular member is made of a metal material whose wettability with the liquid metal member made of the first metal material is lower than at least wettability with the second metal material.

5. The liquid metal ion gun according to claim 4, further comprising:
a groove structure that is provided on an inner side of the recessed portion so as to surround the opening.

6. The liquid metal ion gun according to claim 5,
wherein at least a part of the groove structure is located in a region extending from an outer circumference of the recessed portion to a bottom surface of the recessed portion.

7. The liquid metal ion gun according to claim 1,
wherein the first metal material is gallium, and the second metal material is tungsten.

8. The liquid metal ion gun according to claim 7,
wherein a surface of the beam limiting aperture is wetted with molten gallium and the gallium is then solidified, so that the surface of the beam limiting aperture is formed.

9. An ion beam device comprising:
a vacuum container;
a liquid metal ion gun that is located inside the vacuum container and includes a liquid metal ion source and a beam limiting aperture; and
an acceleration electrode,
wherein the liquid metal ion source includes:
a liquid metal member that is made of a first metal material;
a reservoir that is made of a second metal material and holds the liquid metal member; and
an emitter that is made of the second metal material,
wherein the beam limiting aperture is formed with a liquid metal member made of the first metal material placed on a base made of the second metal material, has an opening enabling an ion beam extracted from the liquid metal ion source to pass therethrough, and limits the diameter of the ion beam, the base of the beam limiting aperture has a recessed portion that is provided so as to include the opening as a having a structure that causes the liquid metal member to gather into a region located around the opening, and a distance between the opening and an outer circumference of the recessed portion is smaller than a capillary length of the liquid metal member made of the first metal material, and
wherein the acceleration electrode is located inside the vacuum container and accelerates the ion beam that has passed through the opening.

* * * * *